United States Patent
Wang et al.

(10) Patent No.: US 11,043,393 B2
(45) Date of Patent: Jun. 22, 2021

(54) OZONE TREATMENT FOR SELECTIVE SILICON NITRIDE ETCH OVER SILICON

(71) Applicants: Mattson Technology, Inc., Fremont, CA (US); Beijing E-Town Semiconductor Technology, Co., LTD, Beijing (CN)

(72) Inventors: Shanyu Wang, Fremont, CA (US); Ting Xie, Fremont, CA (US); Chun Yan, San Jose, CA (US); Xinliang Lu, Fremont, CA (US); Hua Chung, Saratoga, CA (US); Michael X. Yang, Palo Alto, CA (US)

(73) Assignees: Mattson Technology, Inc., Fremont, CA (US); Beijing E-Town Semiconductor Technology Co., Ltd., Beijing (CN)

( * ) Notice: Subject to any disclaimer, the term of this patent is extended or adjusted under 35 U.S.C. 154(b) by 0 days.

(21) Appl. No.: 16/744,403

(22) Filed: Jan. 16, 2020

(65) Prior Publication Data

US 2020/0234969 A1 Jul. 23, 2020

Related U.S. Application Data

(60) Provisional application No. 62/793,477, filed on Jan. 17, 2019.

(51) Int. Cl.
*H01L 21/3065* (2006.01)
*H01L 21/311* (2006.01)
*H01J 37/32* (2006.01)

(52) U.S. Cl.
CPC .... *H01L 21/31116* (2013.01); *H01J 37/3244* (2013.01); *H01J 37/32357* (2013.01)

(58) Field of Classification Search
None
See application file for complete search history.

(56) References Cited

U.S. PATENT DOCUMENTS

| 7,014,788 B1 * | 3/2006 | Fujimura | C23G 5/00 134/1.1 |
| 2012/0238102 A1 * | 9/2012 | Zhang | C09K 13/00 438/718 |

(Continued)

FOREIGN PATENT DOCUMENTS

WO WO-2014156681 A1 * 10/2014 ........ H01L 21/31116

*Primary Examiner* — Shamim Ahmed
(74) *Attorney, Agent, or Firm* — Dority & Manning, P.A.

(57) ABSTRACT

Apparatus, systems, and methods for processing a workpiece are provided. In one example implementation, the workpiece can include a silicon nitride layer and a silicon layer. The method can include admitting an ozone gas into a processing chamber. The method can include exposing the workpiece to the ozone gas. The method can include generating one or more species from a process gas using a plasma induced in a plasma chamber. The method can include filtering the one or more species to create a filtered mixture. The method can further include exposing the workpiece to the filtered mixture in the processing chamber such that the filtered mixture at least partially etches the silicon nitride layer more than the silicon layer. Due to ozone gas reacting with surface of silicon layer prior to etching process with fluorine-containing gas, selective silicon nitride etch over silicon can be largely promoted.

20 Claims, 7 Drawing Sheets

(56) References Cited

U.S. PATENT DOCUMENTS

2015/0371865 A1    12/2015  Chen et al.
2017/0338119 A1*   11/2017  Zhang ............... H01L 21/31122

* cited by examiner

OZONE TREATMENT FOR SELECTIVE SILICON NITRIDE ETCH OVER SILICON

PRIORITY CLAIM

The present application claims the benefit of priority of U.S. Provisional Application Ser. No. 62/793,477, titled "Ozone Treatment for Selective Silicon Nitride Etch over Silicon," filed on Jan. 17, 2019, which is incorporated herein by reference.

FIELD

The present disclosure relates generally to surface treatment of workpieces, such as semiconductor workpieces.

BACKGROUND

The processing of semiconductor workpieces can involve the deposition and removal of different materials layers on a substrate. Device dimension and materials thickness continue to decrease in semiconductor processing with shrinking critical dimensions in semiconductor devices. In advanced device nodes, material removal with high selectivity to other material can become increasingly important to semiconductor device performance. For instance, in some structures, silicon nitride etch over silicon can be of particular importance as such etch can gain widespread applications in semiconductor devices.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The workpiece can include a silicon nitride layer and a silicon layer. The method can include admitting an ozone gas into a processing chamber. The processing chamber can include a workpiece supported on a workpiece support. The method can include exposing the workpiece to the ozone gas. The method can include generating one or more species from a process gas using a plasma induced in a plasma chamber. The method can include filtering the one or more species to create a filtered mixture. The method can include exposing the workpiece to the filtered mixture in the processing chamber such that the filtered mixture at least partially etches the silicon nitride layer more than the silicon layer.

Another example aspect of the present disclosure is directed to a method for processing a workpiece. The workpiece can include a silicon nitride layer and a silicon layer. The method can include admitting an ozone gas into a processing chamber via a separation grid separating a processing chamber from a plasma chamber. The method can include exposing the workpiece to the ozone gas. The method can include generating one or more species from a process gas using a plasma induced in the plasma chamber. The method can include filtering the one or more species to create a filtered mixture via the separation grid. The method can include exposing the workpiece to the filtered mixture in the processing chamber such that the filtered mixture etches the silicon nitride layer more than the silicon layer.

Other example aspects of the present disclosure are directed to systems, methods, and apparatus for surface treatment of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
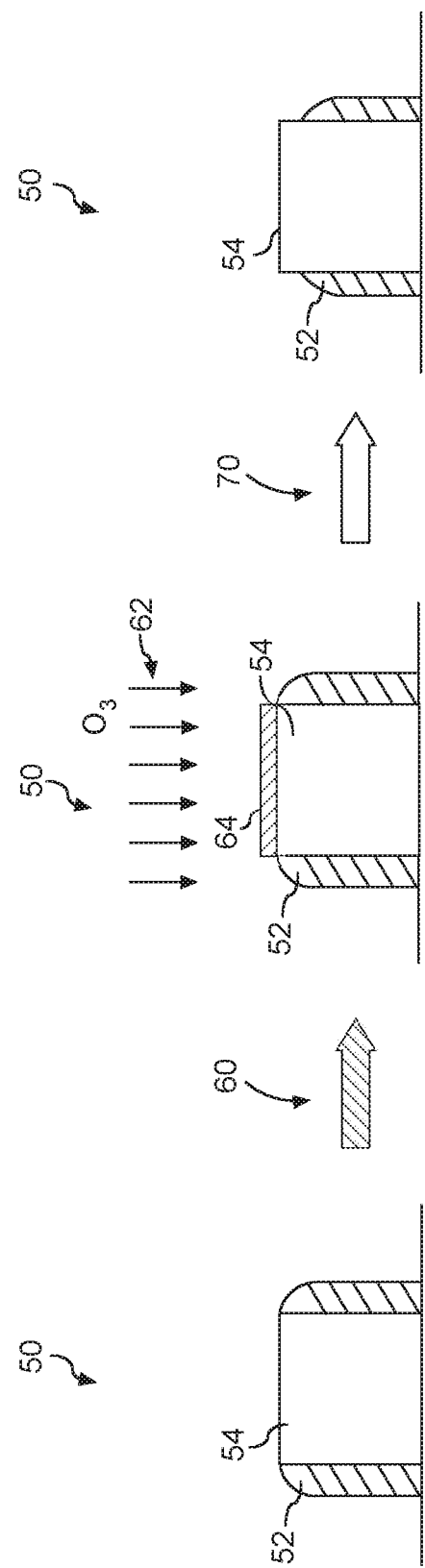
FIG. 1 depicts an example selective silicon nitride etch over silicon process on a structure according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to surface treatment processes to process workpieces, such as semiconductor workpieces, such as semiconductor wafers. The workpieces can have both a silicon nitride layer and a silicon (e.g., polycrystalline silicon, or monocrystalline silicon) layer. Plasma dry etching in semiconductor manufacturing can play a crucial role in fabricating high-performance semiconducting devices, especially with the continuous scaling dimension down below 10 nanometers. Silicon nitride dry etch has gained widespread applications in complementary metal-oxide-semiconductor logic and 3D NAND memory devices, such as gate etching masks, diffusion barrier layers, various spacers, stress generators, sacrificial layers, stopper layers, and other hardmasks. Promoting silicon nitride etch and/or refraining silicon etch (also referred to as selective silicon nitride etch over silicon) can have various applications. For instance, selective silicon nitride etch over silicon can be used for silicon nitride spacer etch or mask removal process that needs substrate materials (e.g., silicon containing materials) to be intact. Selective silicon nitride etch over silicon can be used for silicon nitride removal in self-aligned quadruple patterning (SAQP) process with reduced loss of polycrystalline silicon spacers. Selective silicon nitride etch over silicon can be also used for silicon nitride gate spacer etch in a miniaturized metal insulator-semiconductor field effect transistors (MISFETs) to reduce silicon recess and lower series resistance.

According to example aspects of the present disclosure, ozone surface treatment processes can largely promote selective silicon nitride etch over silicon in etching process with fluorine-containing gas as a process gas. Examples of fluorine-containing gas can include, for instance, tetrafluoromethane ($CF_4$), fluoroform ($CHF_3$), nitrogen trifluoride ($NF_3$), or sulfur hexafluoride ($SF_6$). In some embodiments, the process gas can also include hydrogen-containing gas (e.g., hydrogen ($H_2$), methane ($CH_4$), or ammonia ($NH_3$)), and/or oxygen-containing gas (e.g., oxygen ($O_2$), nitric oxide (NO), or carbon dioxide ($CO_2$)). In some embodiments, selective silicon nitride etch over silicon can also be promoted by adjusting temperature and/or controlling polymer deposition, and/or adjusting parameters (e.g., source power, pressure, flow, and RF bias, etc.) to achieve desired silicon nitride etch rate, uniformity, directionality, and residue control.

According to example aspects of the present disclosure, inert gas activated by a remote plasma source can react with a process gas to generate secondary active species. The secondary active species can be used in semiconductor processing, including surface treatment, materials deposition, and materials removal. Ozone surface treatment can treat a surface of silicon (e.g., polycrystalline silicon, or monocrystalline silicon) to form a dense and controllable silicon oxide surface layer. The ozone surface treatment can effectively slow down silicon etch due to the passivated surface but can exert a negligible influence on the silicon nitride etch, thus achieving a large improvement in silicon nitride (SiN) over silicon (Si) etch selectivity (SiN/Si). For instance, a ratio of etch rate of silicon nitride to an etch rate of silicon can be greater than about 90.

One example aspect of the present disclosure is directed to a method for processing a workpiece having a silicon nitride layer and a silicon (e.g., polycrystalline silicon, or monocrystalline silicon) layer. The method can include admitting an ozone gas into a processing chamber. The processing chamber can include a workpiece supported on a workpiece support. The method can include exposing the workpiece to the ozone gas. The method can include generating one or more species from a process gas (e.g., fluorine-containing gas, hydrogen-containing gas, and/or oxygen-containing gas) using a plasma induced in a plasma chamber. The method can include filtering the one or more species to create a filtered mixture. The method can further include exposing the workpiece to the filtered mixture in the processing chamber such that the filtered mixture at least partially etches the silicon nitride layer more than the silicon layer. Due to ozone gas reacting with surface of silicon layer prior to etching process with fluorine-containing gas, selective silicon nitride etch over silicon can be largely promoted.

In some embodiments, the ozone gas can be admitted with a carrier gas (e.g., a concentration of the ozone gas in the carrier gas can be in the range of about 1% to about 20%). In some embodiments, the ozone gas can be admitted through one or more gas injection ports into or below a separation grid separating the plasma chamber from the processing chamber so that the ozone is injected downstream of the plasma source.

Example aspects of the present disclosure provide a number of technical effects and benefits. For instance, selective silicon nitride etch over silicon can make silicon substrate materials intact for silicon nitride spacer etch or mask removal process. Selective silicon nitride etch over silicon can provide reduced loss of polycrystalline silicon spacers for silicon nitride mandrel removal in self-aligned quadruple patterning (SAQP) process. Selective silicon nitride etch over silicon can also provide reduced silicon recess to lower series resistance for silicon nitride gate spacer etch in a miniaturized metal insulator-semiconductor field effect transistors (MISFETs).

Example process parameters for processing a workpiece (e.g., a workpiece having a silicon nitride layer and a silicon layer) according to example embodiments of the present disclosure are provided below:

Example 1

Process Gas: tetrafluoromethane ($CF_4$) and methane ($CH_4$)
Dilution Gas: oxygen ($O_2$) and nitrogen ($N_2$)
Process Pressure: about 800 millitorr
Plasma Source Power: about 1500 Watt
Workpiece Temperature: about 20° C.
Process Period: about 80 seconds
Flow Rates for Process Gas: about 3500 standard cubic centimeter per minute Aspects of the present disclosure are discussed with reference to a "workpiece" that is a "semiconductor wafer" for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within ten percent (10%) of the stated numerical value. A "pedestal" refers to any structure that can be used to support a workpiece.

FIG. 1 depicts an example selective silicon nitride etch over silicon process on a structure 50 according to example embodiments of the present disclosure. The structure 50 includes a silicon nitride spacer layer 52, and a silicon layer (e.g., a silicon mandrel) 54. In some embodiments (not shown in FIG. 1), the structure 50 can further include one or more sublayers, (e.g., an oxide layer), and/or a substrate (e.g., a silicon substrate).

Ozone surface treatment 60 according to example aspects of the present disclosure can be conducted on the structure 50 to promote selective silicon nitride layer 52 etching over silicon mandrel 54. Surfaces of silicon nitride layer 52 and silicon mandrel 54 are exposed to ozone ($O_3$) gas 62. The ozone gas 62 reacts with a surface of the silicon mandrel 54 to form a silicon oxide layer 64 (e.g., silicon dioxide) on top of the silicon layer (e.g., silicon mandrel 54) prior to etching process 70. Thickness and quality of the silicon oxide layer 64 can be tuned by controlling one or more parameters, e.g., concentration of the ozone gas 62, exposure time, temperature of the structure 50, process pressure, and any other suitable parameter affecting the silicon oxide layer 64.

The etching process 70 according to example aspects of the present disclosure can be conducted after the ozone surface treatment 60 to etch the silicon nitride layer 52. In some embodiments, the etching process 70 can include generating one or more species from a process gas (e.g., fluorine-containing gas, hydrogen gas, and/or oxygen gas) using a plasma induced in a plasma chamber. The etching process 70 can include filtering the one or more species to create a filtered mixture. The etching process 70 can include exposing the structure 50 to the filtered mixture in a processing chamber such that the filtered mixture at least partially etches the silicon nitride layer 52 more than the silicon mandrel 54. As shown FIG. 1, after the etching process 70, the silicon nitride layer 52 is reduced more relative to the silicon layer 54. In some embodiments, the silicon nitride layer 52 can be completely or partially removed, while the silicon layer 54 keeps almost intact.

Figure 2:
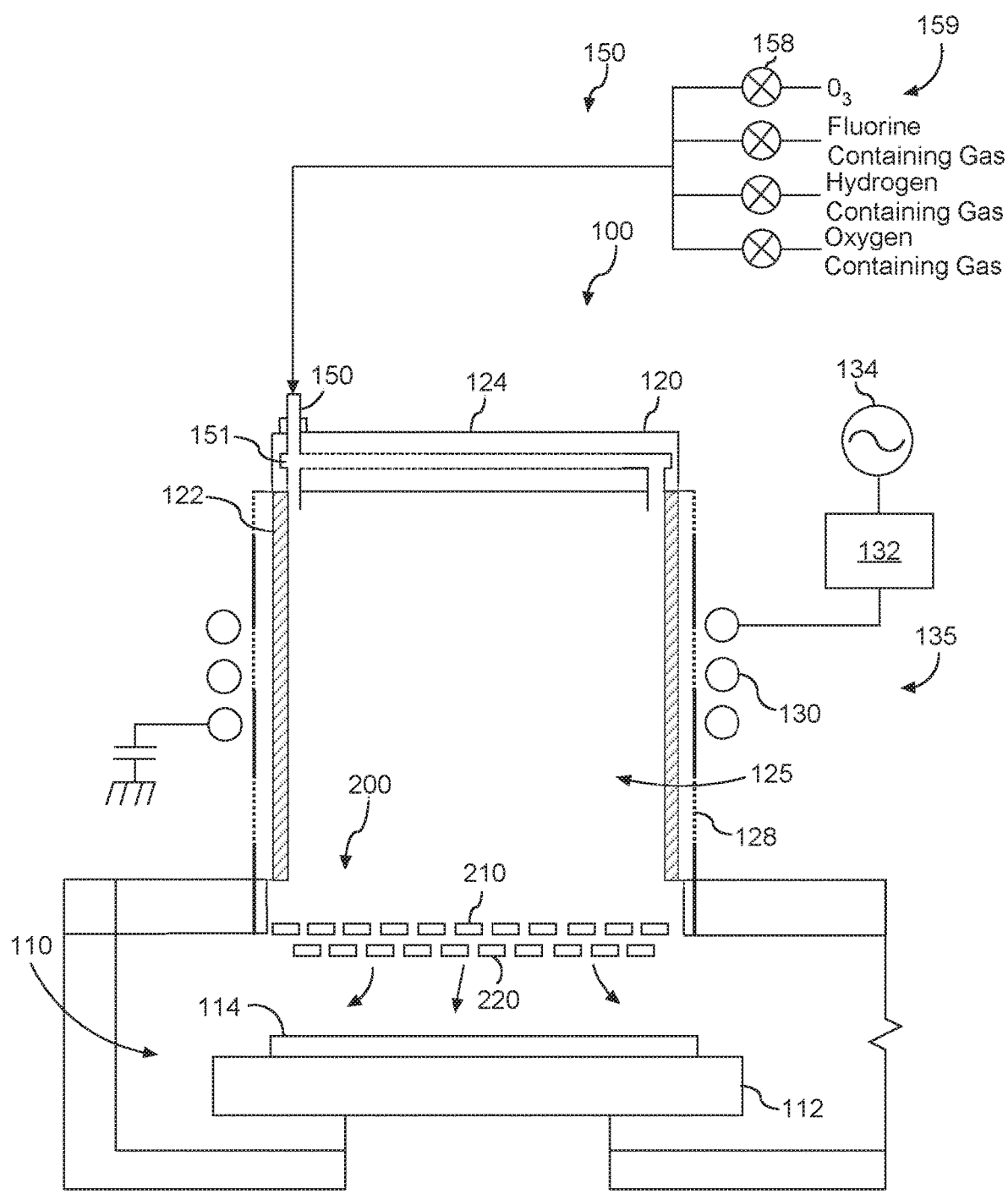
FIG. 2 depicts an example plasma processing apparatus according to example embodiments of the present disclosure.

FIG. 2 depicts an example plasma processing apparatus 100 according to example embodiments of the present disclosure. As illustrated, the plasma processing apparatus 100 includes a processing chamber 110 and a plasma chamber 120 that is separated from the processing chamber 110. The processing chamber 110 includes a workpiece support or pedestal 112 operable to hold a workpiece 114 to be processed, such as a semiconductor wafer. In this example illustration, a plasma is generated in the plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. The dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., a hydrogen gas and a carrier gas) can be provided to the chamber interior from a gas supply 150 and annular gas distribution channel 151 or other suitable gas introduction mechanism. When the induction coil 130 is energized with RF power from the RE power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 2, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 2, according to example aspects of the present disclosure, the apparatus 100 can include a gas delivery system 150 configured to deliver ozone gas and process gas to the plasma chamber 120, for instance, via gas distribution channel 151 or other distribution system (e.g., showerhead). The gas delivery system can include a plurality of feed gas lines 159. The teed gas lines 159 can be controlled using valves and/or mass flow controllers to deliver a desired amount of gases into the plasma chamber as process gas. As shown in FIG. 2, the gas delivery system 150 can include feed gas line(s) for delivery of an ozone gas, feed gas line(s) for delivery of fluorine-containing gas (e.g., $CF_4$, $CHF_3$, $NF_3$, and/or $SF_6$), feed gas line(s) for delivery of a hydrogen-containing gas (e.g., $H_2$, $CH_4$, or $NH_3$), and/or feed gas line(s) for delivery of an oxygen-containing gas (e.g., $O_2$, NO, or $CO_2$). In some embodiments, the ozone gas, the fluorine-containing gas, and/or the oxygen-containing gas can be mixed with an inert gas that can be called a "carrier" gas. For instance, a concentration of the ozone gas in the carrier gas can be in the range of about 1% to about 20%. A control valve and/or mass flow controller 158 can be used to control a flow rate of each feed gas line to flow an ozone gas or a process gas into the plasma chamber 120.

In some embodiments, ozone surface treatment can be conducted prior to an etch process. Ozone gas can be delivered into the plasma chamber 120 prior to a process gas. For instance, ozone gas can be delivered into the plasma chamber 120 and can pass through the separation grid 200 to reach the workpiece 114. In some embodiments, ozone gas can be delivered into the processing chamber 110 via the separation grid 200 or below the separation grid 200 so that the ozone is injected downstream of the plasma source. The workpiece 114 can include a silicon nitride layer and a silicon layer. The ozone gas can react with a surface of the silicon layer to form a silicon oxide layer. Subsequent to the ozone surface treatment, a process gas (e.g., fluorine-containing gas, hydrogen-containing gas, and/or oxygen-containing gas) can be delivered into the plasma chamber 120 to generate species. The species can be filtered by the separation grid 200 to create a filtered mixture. The workpiece 114 can be exposed to the filtered mixture in the processing chamber 110 such that the filtered mixture can etch the silicon nitride layer more and/or faster than the silicon layer.

In some embodiments, a cyclic ozone surface treatment and etch process can be conducted to improve the etch selectivity. For instance, ozone surface treatment can be conducted and then partial etch process can be conducted; then ozone surface treatment and subsequent partial etch process can be conducted again. The ozone surface treatment and partial etch can be cycled for once or multiple time to reach a target etch amount.

Figure 3:
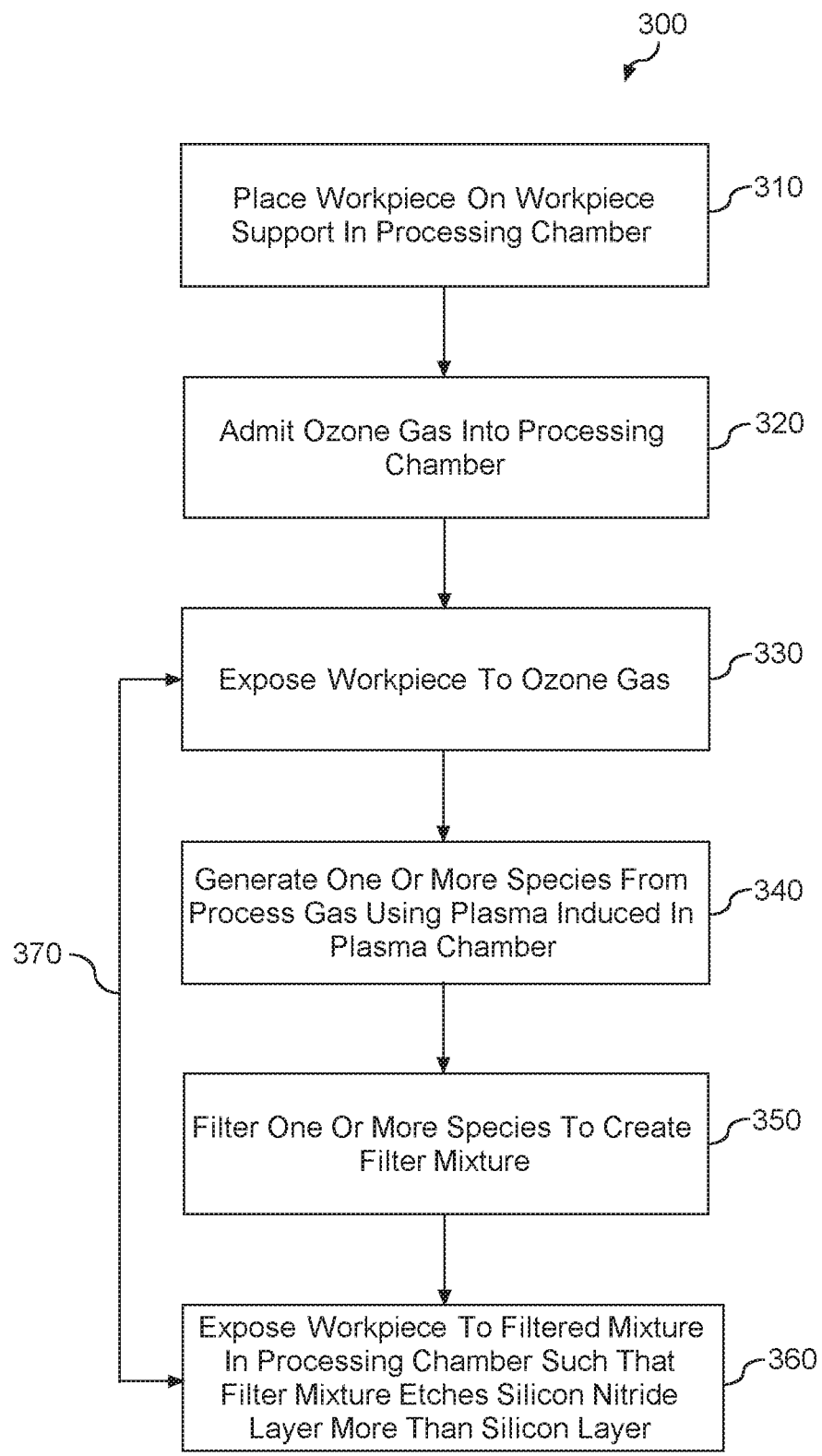
FIG. 3 depicts a flow diagram of an example process according to example embodiments of the present disclosure.

FIG. 3 depicts a flow diagram of an example method (300) according to example embodiments of the present disclosure. The method (300) will be discussed with reference to the plasma processing apparatus 100 of FIG. 2 by way of example. The method (300) can be implemented in any suitable plasma processing apparatus. FIG. 3 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (310), the method can include placing a workpiece on a workpiece support in a processing chamber. For instance, the workpiece 114 can include a silicon nitride layer and a silicon layer (e.g., structure 50 in FIG. 1). The workpiece 114 can be placed on a substrate holder or pedestal 112 in a processing chamber 110.

At (320), the method can include admitting an ozone gas into the processing chamber. For instance, an ozone gas can be delivered by a feed gas line(s) into a plasma chamber 120, and the ozone gas can pass through a separation grid 200 into the processing chamber 110. As another example, an ozone gas can be delivered via one or more gas injection ports into a separation grid 200 or below the separation grid 200 so that the ozone gas is injected downstream of the plasma source.

At (330), the method can include exposing the workpiece to the ozone gas. For instance, the workpiece 114 can be exposed to the ozone gas. The ozone gas can react with surface of a silicon layer of the workpiece 114 to form a silicon oxide layer. In some embodiments, thickness and quality of the silicon oxide layer can be controlled by adjusting one or more parameters, e.g., concentration of the ozone gas, workpiece temperature, process pressure, process time and/or any other suitable parameter affecting the silicon oxide layer.

At (340), the method can include generating one or more species from a process gas using a plasma induced in a plasma chamber. For instance, a process gas (e.g., fluorine-containing gas, hydrogen-containing gas, and/or oxygen-containing gas) can be admitted with a controllable flow rate via the feed gas lines into a plasma chamber 120 to induce a plasma. One or more species can be generated using the plasma.

At (350), the method can include filtering the one or more species to create a filtered mixture. For instance, the one or more species can be filtered by a separation grid 200 to create a filtered mixture.

At (360), the method can include exposing the workpiece to the filtered mixture in the processing chamber such that the filtered mixture at least partially etches the silicon nitride layer more than the silicon layer. For instance, the workpiece 114 can be exposed to the filtered mixture in the processing chamber 110 such that the filtered mixture at least partially etches the silicon nitride layer more than the silicon layer.

At (370), the method can include a cyclic process by alternating exposures of the workpiece to the ozone gas and to the filtered mixture. As such, stable passivation of silicon can be achieved such that at least the selective etch of silicon nitride layer over the silicon layer can be preserved for a relatively long period. For instance, the workpiece 114 can be alternatively exposed to the ozone gas and to the filtered mixture in the processing chamber 110 such that a passivating layer can be at least partially retained during process period and the filtered mixture can at least partially etch the silicon nitride layer more than the silicon layer.

Figure 4:
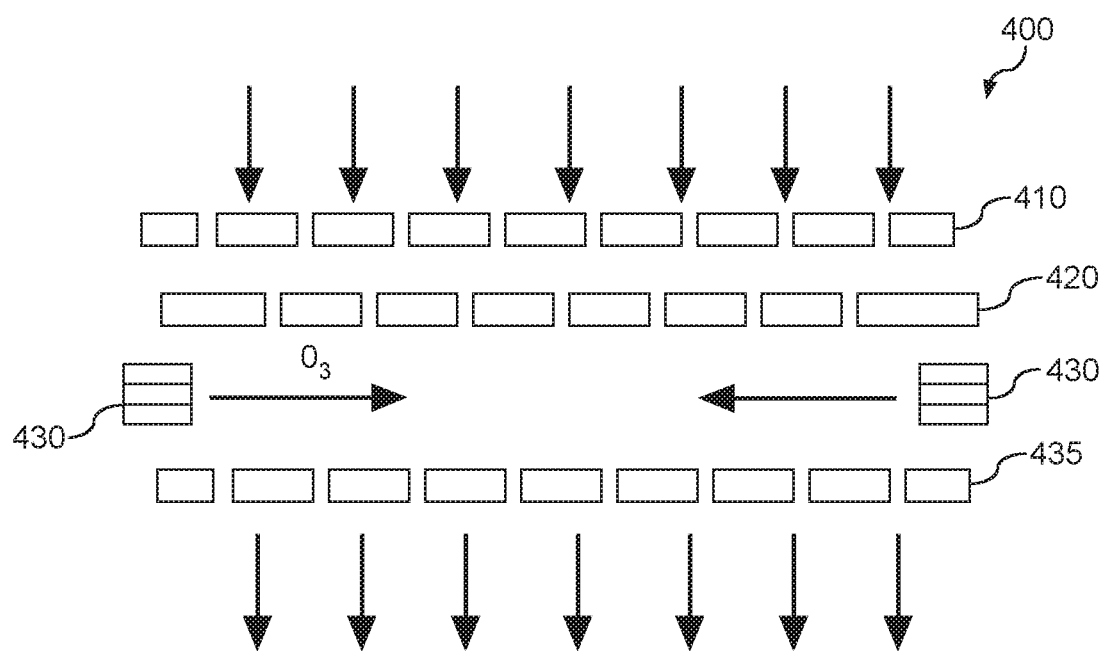
FIG. 4 depicts example injection of an ozone containing gas using post-plasma injection according to example embodiments of the present disclosure.

FIG. 4 depicts example injection of ozone using post-plasma gas injection according to example embodiments of the present disclosure. The separation grid 400 includes a first grid plate 410 and a second grid plate 420 disposed in parallel relationship. The first grid plate 410 and the second grid plate 420 can provide for ion/UV filtering. The separation grid 400 can be one embodiment of the separation grid 200.

The first grid plate 410 can have a first grid pattern having a plurality of holes. The second grid plate 420 can have a second grid pattern having a plurality of holes. The first grid pattern can be the same as or different from the second grid pattern. Species from the plasma can be exposed to the separation grid 400. Charged particles (e.g., ions) can recombine on the walls in their path through the holes of each grid plate 410, 420 in the separation grid 400, Neutral species can flow relatively freely through the holes in the first grid plate 410 and the second grid plate 420.

Subsequent to the second grid plate 420, a gas injection source 430 can be configured to introduce ozone gas into the species passing through the separation grid 400. A mixture can pass through a third grid plate 435 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the ozone gas can be mixed with the species at any point in the separation grid and/or after the separation grid in the processing chamber. For instance, the gas source 430 can be located between first grid plate 410 and second grid plate 420.

Figure 5:
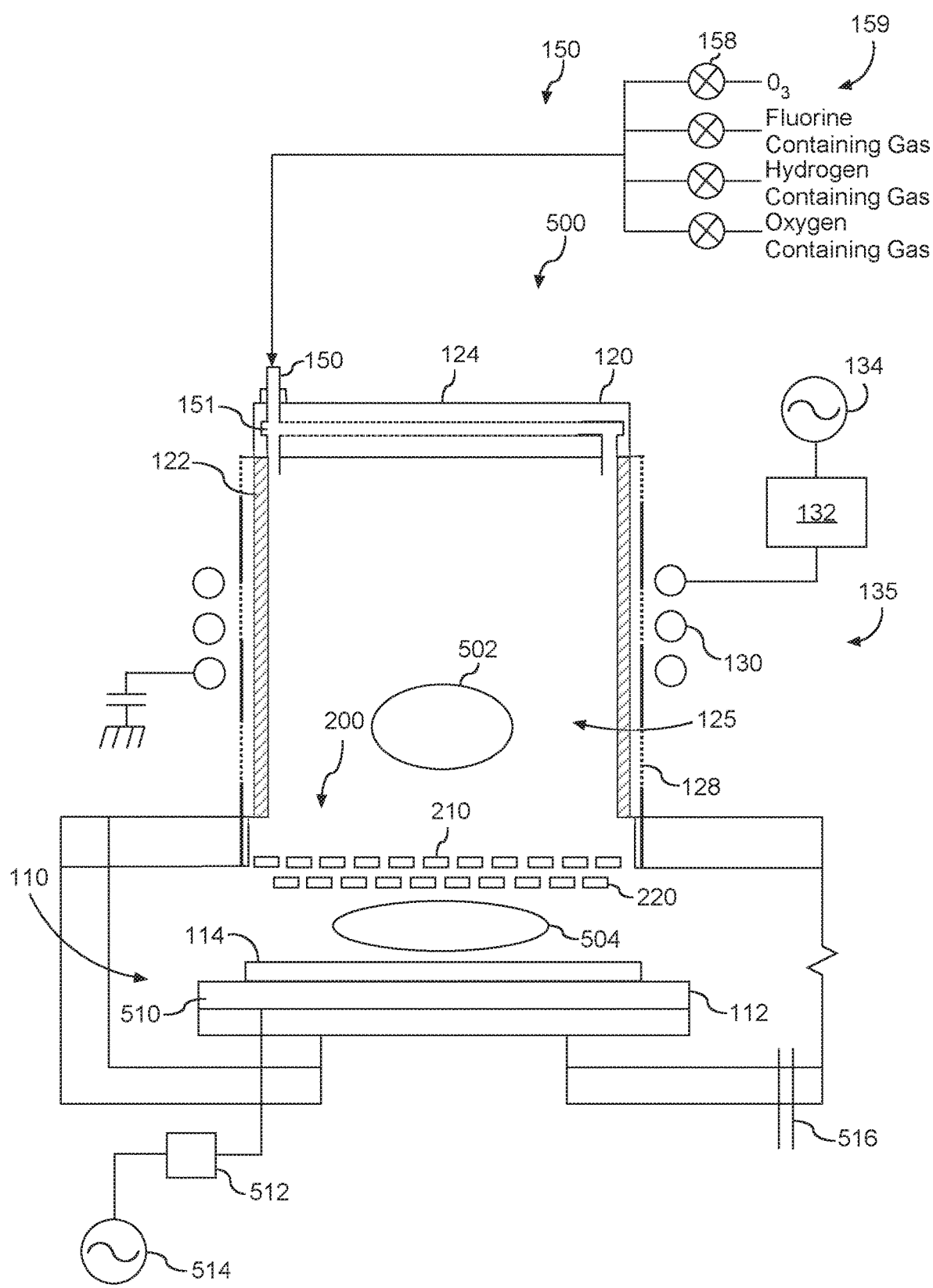
FIG. 5 depicts an example plasma processing apparatus according to example embodiments of the present disclosure.

FIG. 5 depicts an example plasma processing apparatus 500 that can be used to implement processes according to example embodiments of the present disclosure. The plasma processing apparatus 500 is similar to the plasma processing apparatus 100 of FIG. 3.

More particularly, plasma processing apparatus 500 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124, The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 5, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 5 is operable to generate a first plasma 502 (e.g., a remote plasma) in the plasma chamber 120 and a second plasma 504 (e.g., a direct plasma) in the processing chamber 110. The first plasma 502 can be generated by an inductively coupled plasma source. The second plasma 504 can be generated by, for instance, a capacitively coupled plasma source (e.g., bias). As used herein, a "remote plasma" refers to a plasma generated remotely from a workpiece, such as in a plasma chamber separated from a workpiece by a separation grid. As used herein, a "direct plasma" refers to a plasma that is directly exposed to a workpiece, such as a plasma generated in a processing chamber having a pedestal operable to support the workpiece.

More particularly, the plasma processing apparatus 500 of FIG. 5 includes a bias source having bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. In some embodiments, ion energy can be controlled using the bias source. The processing chamber 110 can include a gas exhaust port 516 for evacuating a gas from the processing chamber 110.

As shown in FIG. 5, according to example aspects of the present disclosure, the apparatus 100 can include a gas delivery system 150 configured to deliver ozone gas and process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 2, the gas delivery system 150 can include feed gas line(s) for delivery of an ozone gas, feed gas line(s) for delivery of fluorine-containing gas (e.g., $CF_4$, $CHF_3$, $NF_3$, and/or $SF_6$), feed gas line(s) for delivery of a hydrogen-containing gas (e.g., $H_2$, $CH_4$, or $NH_3$), and/or teed gas line(s) for delivery of an oxygen-containing gas (e.g., $O_2$, NO, or $CO_2$). In some embodiments, the ozone gas, the fluorine-containing gas, and/or the oxygen-containing gas can be mixed with an inert gas (e.g., Ar or He) that can be called a "carrier" gas. For instance, a concentration of the ozone gas in the carrier gas can be in the range of about 1% to about 20%. A control valve and/or mass flow controller 158 can be used to control a flow rate of each feed gas line to flow an ozone gas or a process gas into the plasma chamber 120.

In some embodiments, ozone surface treatment can be conducted prior to an etch process. Ozone gas can be delivered into the plasma chamber 120 prior to a process gas. For instance, ozone gas can be delivered into the plasma chamber 120 and can pass through the separation grid 200 to reach the workpiece 114. In some embodiments, ozone gas can be delivered into the processing chamber 110 via the separation grid 200 or below the separation grid 200 so that the ozone is injected downstream of the plasma source. The workpiece 114 can include a silicon nitride layer and a silicon layer. The ozone gas can react with a surface of the silicon layer to form a silicon oxide layer. Subsequent to the ozone surface treatment, a process gas (e.g., fluorine-containing gas, hydrogen-containing gas, and/or oxygen-containing gas) be delivered into the plasma chamber 120 to generate species. The species can be filtered by the separation grid 200 to create a filtered mixture. The workpiece 114 can be exposed to the filtered mixture in the processing chamber 110 such that the filtered mixture can etch the silicon nitride layer more than the silicon layer.

In some embodiments, a cyclic ozone surface treatment and an etch process can be conducted to improve the etch selectivity. The ozone surface treatment can be conducted and then partial etch process can be conducted, then the ozone surface treatment and subsequent partial etch process can be conducted again. The ozone surface treatment and partial etch can be cycled for once or multiple time to reach a target etch amount.

Figure 6:
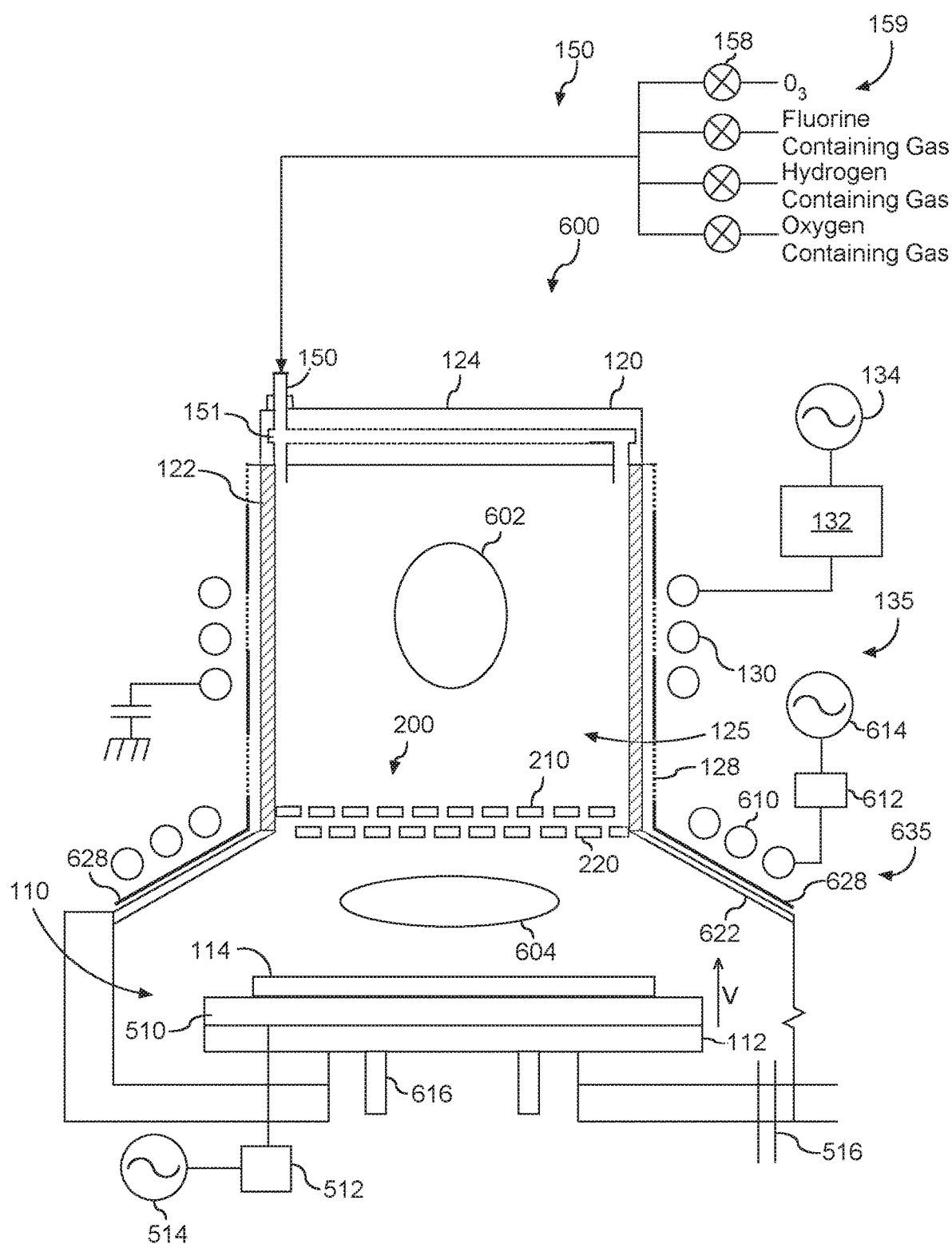
FIG. 6 depicts an example plasma processing apparatus according to example embodiments of the present disclosure.

FIG. 6 depicts a processing chamber 600 similar to that of FIG. 2 and FIG. 5. More particularly, plasma processing apparatus 600 includes a processing chamber 110 and a plasma chamber 120 that is separated from the processing chamber 110. Processing chamber 110 includes a substrate holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of substrate 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 6, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 6 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The pedestal 112 can be movable in a vertical direction noted as "V." For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

The plasma processing apparatus 600 of FIG. 6 includes a bias source having bias electrode 510 in the pedestal 112. The bias electrode 510 can be coupled to an RF power generator 514 via a suitable matching network 512. In some embodiments, ion energy can be controlled using the bias source. The processing chamber 110 can include a gas exhaust port 716 for evacuating a gas from the processing chamber 110.

As shown in FIG. 6, according to example aspects of the present disclosure, the apparatus 100 can include a gas delivery system 150 configured to deliver ozone gas and process gas to the plasma chamber 120, for instance, via gas distribution channel 151 or other distribution system (e.g., showerhead). The gas delivery system can include a plurality of feed gas lines 159. The feed gas lines 159 can be controlled using valves and/or mass flow controllers to deliver a desired amount of gases into the plasma chamber as process gas. As shown in FIG. 2, the gas delivery system 150 can include feed gas line(s) for delivery of an ozone gas, feed gas line(s) for delivery of fluorine-containing gas e.g., $CF_4$, $CHF_3$, $NF_3$, and/or $SF_6$), feed gas line(s) for delivery of a hydrogen-containing gas (e.g., $H_2$, $CH_4$, or $NH_3$), and/or feed gas line(s) for delivery of an oxygen-containing gas (e.g., $O_2$, NO, or $CO_2$). In some embodiments, the ozone gas, the fluorine-containing gas, and/or the oxygen-containing gas can be mixed with an inert gas that can be called a "carrier" gas (e.g., Ar or He). For instance, a concentration of the ozone gas in the carrier gas can be in the range of about 1% to about 20%. A control valve and/or mass flow controller 158 can be used to control a flow rate of each feed gas line to flow an ozone gas or a process gas into the plasma chamber 120.

In some embodiments, ozone surface treatment can be conducted prior to an etch process. Ozone gas can be delivered into the plasma chamber 120 prior to a process gas. For instance, ozone gas can be delivered into the plasma chamber 120 and can pass through the separation grid 200 to reach the workpiece 114. In some embodiments, ozone gas can be delivered into the processing chamber 110 via the separation grid 200 or below the separation grid 200 so that the ozone is injected downstream of the plasma source. The workpiece 114 can include a silicon nitride layer and a silicon layer. The ozone gas can react with a surface of the silicon layer to form a silicon oxide layer. Subsequent to the ozone surface treatment, a process gas (e.g., fluorine-containing gas, hydrogen-containing gas, and/or oxygen-containing gas) can be delivered into the plasma chamber 120 to generate species. The species can be filtered by the separation grid 200 to create a filtered mixture. The workpiece 114 can be exposed to the filtered mixture in the processing chamber 110 such that the filtered mixture can etch the silicon nitride layer more than the silicon layer.

In some embodiments, a cyclic ozone surface treatment and an etch process can be conducted to improve the etch selectivity. The ozone surface treatment can be conducted and then partial etch process can be conducted, then the ozone surface treatment and subsequent partial etch process can be conducted again. The ozone surface treatment and partial etch can be cycled for once or multiple time to reach a target etch amount.

Figure 7:
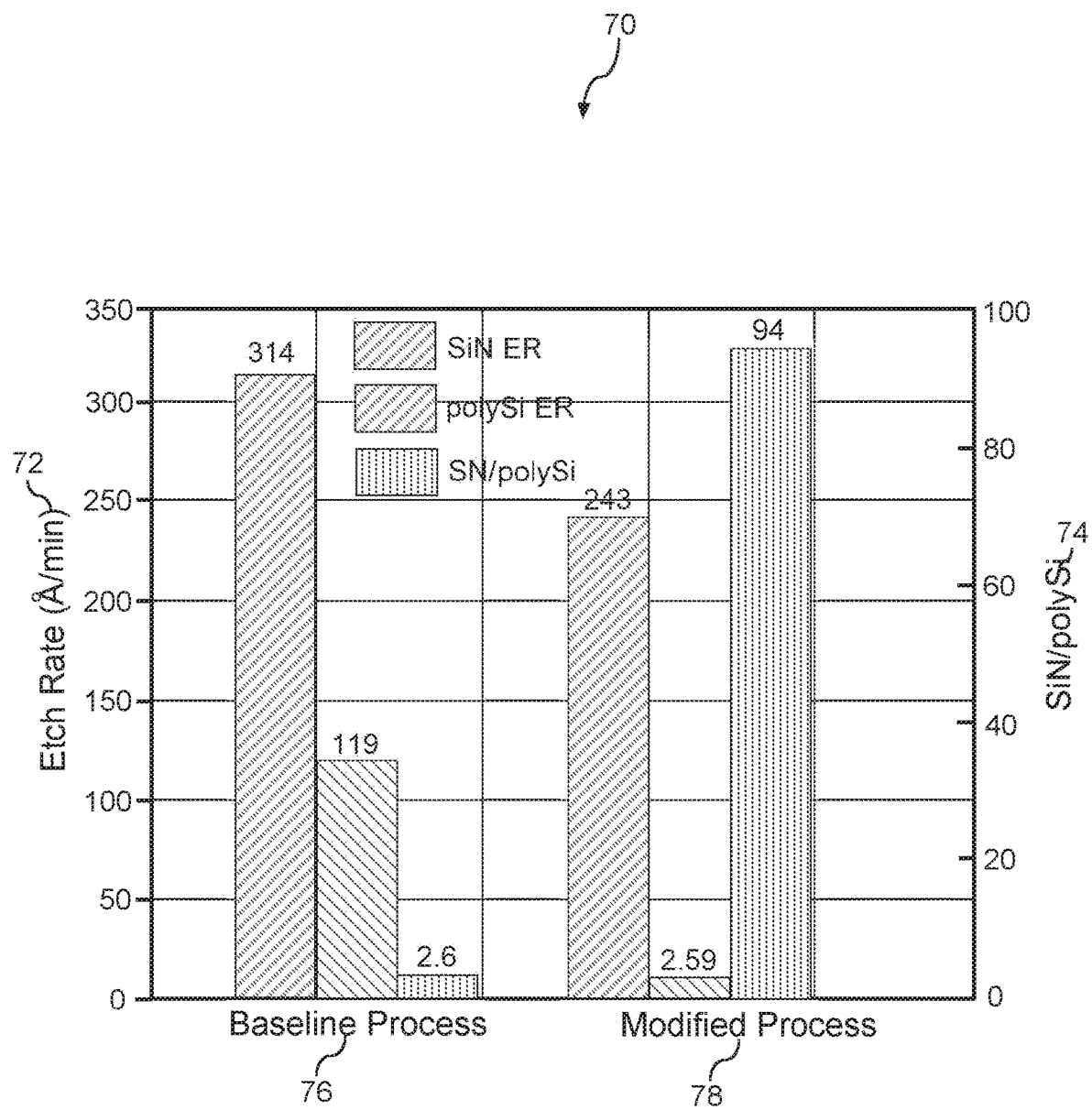
FIG. 7 depicts an example comparison between conventional silicon nitride and silicon etch process and selective silicon nitride etch over silicon process according to example embodiments of the present disclosure.

FIG. 7 depicts an example comparison 70 between conventional silicon nitride and silicon etch process 76 (also referred to as a baseline process) and selective silicon nitride etch over silicon process 78 according to example embodiments of the present disclosure. Bar graph for the comparison is plotted in an etch rate axis 72 and a ratio of an etch rate of silicon nitride (SiN) to an etch rate of silicon (PolySi ER) axis 74. As shown in FIG. 7, the conventional process 76 shows that an etch rate of silicon nitride (SiN ER) is about 314 Å/min and an etch rate of polycrystalline silicon (polySi ER) is about 119 Å/min. Accordingly, a ratio of SiN ER to polySi ER is about 2.6. In contrast, the selective silicon nitride etch over silicon process 78 shows that an etch rate of silicon nitride (SiN ER) is about 243 Å/min and an etch rate of polycrystalline silicon (polySi ER) is about 2.59 Å/min, and a ratio of SiN ER to poly Si ER is about 94. Compared with the conventional process 76, the selective silicon nitride etch over silicon process 78 can retain and/or promote silicon nitride etching and refrain silicon etching to provide a higher ratio of SiN ER to poly Si ER.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a silicon nitride layer and a silicon layer, the method comprising:
    admitting an ozone gas into a processing chamber, the processing chamber comprising the workpiece supported on a workpiece support;
    exposing the workpiece to the ozone gas;
    generating one or more species from a process gas using a plasma induced in a plasma chamber;
    filtering the one or more species to create a filtered mixture;
    exposing the workpiece to the filtered mixture in the processing chamber such that the filtered mixture at least partially etches the silicon nitride layer more than the silicon layer;
    wherein the workpiece is exposed to the ozone gas prior to being exposed to the filtered mixture.

2. The method of claim 1, further comprising alternating exposing the workpiece to the ozone gas and exposing the workpiece to the filtered mixture such that the filtered mixture at least partially etches the silicon nitride layer faster than the silicon layer.

3. The method of claim 1, wherein a ratio of an etch rate of silicon nitride to an etch rate of silicon is greater than about 90.

4. The method of claim 1, wherein the process gas comprises a fluorine-containing gas.

5. The method of claim 4, wherein the fluorine-containing gas comprises one or more of tetrafluoromethane ($CF_4$), fluoroform ($CHF_3$), nitrogen trifluoride ($NF_3$), or sulfur hexafluoride ($SF_6$).

6. The method of claim 5, wherein the tetrafluoromethane ($CF_4$) or the nitrogen trifluoride ($NF_3$) is injected with a controllable flow rate through a gas injection source.

7. The method of claim 1, wherein the process gas comprises a hydrogen-containing gas.

8. The method of claim 7, wherein the hydrogen-containing gas comprises one or more of hydrogen ($H_2$), methane ($CH_4$), or ammonia ($NH_3$).

9. The method of claim 1, wherein the process gas comprises an oxygen-containing gas.

10. The method of claim 9, wherein the oxygen-containing gas comprises one or more of oxygen ($O_2$), nitric oxide (NO), or carbon, dioxide ($CO_2$).

11. The method of claim 1, wherein the ozone gas is admitted with a carrier gas.

12. The method of claim 11, wherein a concentration of the ozone gas in the carrier gas is in the range of about 1% to about 20%.

13. The method of claim 1, wherein filtering the one or more species to create the filtered mixture comprises filtering the one or more species to create the filtered mixture via a separation grid separating the plasma chamber from the processing chamber.

14. The method of claim 13, wherein the ozone gas is admitted through one or more gas injection ports into the separation grid.

15. The method of claim 1, wherein the ozone gas reacts with the silicon layer to form a silicon oxide layer on top of the silicon layer.

16. The method of claim 1, further comprising controlling an ion energy of the plasma by a bias source in the processing chamber.

17. A method for processing a workpiece, the workpiece comprising a silicon nitride layer and a silicon layer, the method comprising:
    admitting an ozone gas into a processing chamber via a separation grid separating a processing chamber from a plasma chamber;
    exposing the workpiece to the ozone gas;
    generating one or more species from a process gas using a plasma induced in the plasma chamber;
    filtering the one or more species to create a filtered mixture via the separation grid;
    exposing the workpiece to the filtered mixture in the processing chamber such that the filtered mixture etches the silicon nitride layer more than the silicon layer;
    wherein the workpiece is exposed to the ozone gas prior to being exposed to the filtered mixture.

18. The method of claim 17, further comprising alternating exposing the workpiece to the ozone gas and exposing the workpiece to the filtered mixture such that the filtered mixture at least partially etches the silicon nitride layer faster than the silicon layer.

19. The method of claim 17, wherein the ozone gas is admitted through one or more gas injection ports into the separation grid.

20. The method of claim 17, wherein the ozone gas reacts with the silicon layer to form a silicon oxide layer on top of the silicon layer.

* * * * *